(12) United States Patent  
Lin

(10) Patent No.: US 7,982,519 B2  
(45) Date of Patent: Jul. 19, 2011

(54) CENTRALIZING THE LOCK POINT OF A SYNCHRONOUS CIRCUIT

(75) Inventor: Feng Lin, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/941,749

(22) Filed: Nov. 8, 2010

(65) Prior Publication Data

US 2011/0050305 A1    Mar. 3, 2011

Related U.S. Application Data

(63) Continuation of application No. 11/484,163, filed on Jul. 11, 2006, now Pat. No. 7,830,194, which is a continuation of application No. 10/730,609, filed on Dec. 8, 2003, now Pat. No. 7,098,714.

(51) Int. Cl.
*H03K 3/00* (2006.01)
*H03L 7/06* (2006.01)

(52) U.S. Cl. ........................................ 327/291; 327/158

(58) Field of Classification Search .................. None
See application file for complete search history.

(56) References Cited

U.S. PATENT DOCUMENTS

| | | |
|---|---|---|
| 5,771,264 A | 6/1998 | Lane |
| 5,940,608 A | 8/1999 | Manning |
| 6,018,259 A | 1/2000 | Lee |
| 6,018,560 A | 1/2000 | Kim |
| 6,069,506 A | 5/2000 | Miller, Jr. et al. |
| 6,128,248 A | 10/2000 | Idei et al. |
| 6,140,854 A | 10/2000 | Coddington et al. |
| 6,166,990 A | 12/2000 | Ooishi et al. |
| 6,205,086 B1 | 3/2001 | Hanzawa et al. |
| 6,294,938 B1 * | 9/2001 | Coddington et al. ......... 327/158 |
| 6,373,913 B1 * | 4/2002 | Lee ................... 375/376 |
| 6,417,715 B2 * | 7/2002 | Hamamoto et al. .......... 327/291 |
| 6,424,193 B1 * | 7/2002 | Hwang ......................... 327/158 |
| 6,653,875 B2 * | 11/2003 | Partsch et al. ................. 327/158 |
| 6,677,791 B2 * | 1/2004 | Okuda et al. .................. 327/158 |
| 6,735,653 B2 * | 5/2004 | O Mathuna et al. .......... 710/105 |
| 6,930,524 B2 * | 8/2005 | Drexler ......................... 327/158 |
| 7,092,480 B1 * | 8/2006 | Younis ......................... 377/122 |
| 7,830,194 B2 * | 11/2010 | Lin ............................... 327/291 |
| 2004/0100313 A1 * | 5/2004 | Cho .............................. 327/158 |

* cited by examiner

*Primary Examiner* — Lincoln Donovan
*Assistant Examiner* — Khareem E Almo
(74) *Attorney, Agent, or Firm* — Lerner, David, Littenberg, Krumholz & Mentlik, LLP

(57) ABSTRACT

A system and method to establish the lock point of a digital synchronous circuit (e.g., a DLL) at the center of or close to the center of its delay line is disclosed. The synchronous circuit is configured to selectively use either a reference clock or its inverted version as the clock signal input to the delay line based on a relationship among the phases of the reference clock, the inverted reference clock, and a feedback clock may be used during determination of the phase relationship. The selective use of the opposite phase of the reference clock for the input of the delay line results in centralization of the lock point for most cases as well as improvement in the tuning range and the time to establish the initial lock, without requiring an additional delay line.

13 Claims, 9 Drawing Sheets

$$t_{PE} < t_D < \frac{t_{CK}}{2}$$

CENTRALIZING THE LOCK POINT OF A SYNCHRONOUS CIRCUIT

CROSS-REFERENCE TO RELATED APPLICATIONS

This application is a continuation of U.S. patent application Ser. No. 11/484,163, filed on Jul. 11, 2006, and which is due to issue as U.S. Pat. No. 7,830,194 on Nov. 9, 2010, which is a continuation of U.S. patent application Ser. No. 10/730,609, filed on Dec. 8, 2003, and issued on Aug. 29, 2006 as U.S. Pat. No. 7,098,714, the disclosures of which are hereby incorporated herein by reference.

REFERENCE TO RELATED APPLICATION

The disclosure in the present application is related to the disclosure provided in the commonly assigned U.S. patent application Ser. No. 09/921,614, titled "Method to Improve the Efficiency of Synchronous Minor Delays and Delay Locked Loops," filed on Aug. 3, 2001, now U.S. Pat. No. 6,798,259.

BACKGROUND

1. Field of the Disclosure

The present disclosure generally relates to synchronous circuits and, more particularly, to a system and method to centralize the lock point of a synchronous circuit.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other memory devices, it is desirable to have the data output from the memory synchronized with the system clock that also serves the microprocessor. Delay-locked loops (DLLs) are synchronous circuits used in SDRAMs to synchronize an external clock (e.g., the system clock serving a microprocessor) and an internal clock (e.g., the clock used internally within the SORAM to perform data read/write operations on various memory cells) with each other. Typically, a DLL is a feedback circuit that operates to feed back a phase difference *related signal to control a delay line, with the timing of one clock signal (e.g., the system clock) is advanced or delayed until its rising edge is coincident (or "locked") with the rising edge of a second clock signal (e.g., the memory internal clock).

FIG. 1 depicts a simplified block diagram of a prior art delay-locked loop (DLL) 10 that can be internal to an SDRAM (not shown). The DLL 10 receives a reference clock 12 as an input and generates an output clock or the CLKOut signal 13 at its output. A Tree_CLK signal 13* is in turn, fed back as a feedback clock 14 as discussed later. The reference clock 12 is interchangeably referred to herein as "Ref" or "Ref clock signal" or "Ref clock"; whereas the feedback clock 14 is interchangeably referred to herein as "FB" or "FB clock signal" or "FB clock." The reference clock 12 is typically the external system clock serving the microprocessor or a delayed/buffered version of it. In the embodiment of FIG. 1, the system clock CLK 24 and its inverted version CLK_25 are fed into a clock receiver 23 and appear at the receiver's outputs 26 and 27, respectively. The system clocks are then buffered through a clock buffer 28. One output of the clock buffer 28—i.e., the Ref clock 12—thus is a buffered version of the system clock CLK 24. The other output 30 of the clock buffer 28 is a buffered version of the inverted system clock CLK_25 or the inverted version of the Ref clock 12. This output 30 of the clock buffer 28 is interchangeably referred to herein as the "inverted reference clock" or "Ref* clock" or "Ref* clock signal." In traditional synchronous circuits with a single delay line (e.g., the DLL. circuit 10 with a delay line 16), only the Ref clock 12 is input into the delay line as shown in FIG. 1.

The Ref clock 12 may be fed into the delay line 16 via a buffer 15, The output of the buffer 15 is a CLKIn signal 17, which is a buffered version of the reference clock 12. The clock output of the delay line 16—the CLKOut signal 13—is used to provide the internal clock (not shown) used by the SDRAM to perform data read/write operations on memory cells and to transfer the data out of the SDRAM to the data requesting device (e.g., a microprocessor). Thus, as shown in FIG. 1, the CLKOut 13 is sent to a clock distribution network or clock tree circuit 20 whose output 21 may be coupled to SDRAM clock driver and data output stages to clock the data retrieval and transfer operations. As can be seen from FIG. 1, the CLKOut signal 13 (and, hence, the FB clock 14) is generated using a delay line 16, which introduces a specific delay into the input Ref clock (or CLKIn 17) to obtain the "lock" condition.

A phase detector (PD) 18 compares the relative timing of the edges of the system clock CLK 24 and the memory's internal clock ('tot shown) by comparing the relative timing of their respective representative signals—the input clock signal (the Ref clock 12) which relates to the system clock 24, and the PB clock signal 14 which relates to the memory's internal clock—so as to establish the lock condition. As shown in FIG. 1, an I/O model circuit 22 may be a part of the DLL 10 to function as a buffer or dummy delay circuit for the Tree CLK signal 13* before the Tree CLK signal 13* is fed into the phase detector 18 as the PB clock 14. The Tree_CLK signal 13* may be obtained from the clock tree circuit 20 in such a manner as to make the PB clock 14 effectively represent the memory's internal clock, which may be present through the clock driver and data output stages. The I/O model 22 may be a replica of the system clock receiver 23, the external clock buffer 28, and the clock and data output path (including the clock driver coupled to the output 21) so as to match respective delays imparted by these stages to the system clock 24 and the CLKOut signal 13, thereby making the Ref clock 12 and the PB clock 14 resemble, respectively, the system clock CLK 24 and the internal clock of the memory as closely as possible. Thus, the I/O model 22 attempts to maintain the phase relationship between the Ref clock 12 and the FB clock 14 as close as possible to the phase relationship that exists between the system clock CLK 24 and the memory's internal clock. The Ref clock 12 and fB clock 14 are fed as inputs into the phase detector 18 for phase comparison. The output of the PD 18—a delay adjustment signal or indication 19—controls the amount of delay imparted to the CLKIn signal 17 by the delay line 16.

The delay adjustment signal 19 may determine whether the Ref clock 12 should be shifted left (SL.) or shifted right (SR) through the appropriate delay in the delay line 16 so as to match the phases of the Ref clock 12 and the FB clock 14 to establish the lock condition. The delay imparted to the Ref clock 12 by the delay line 16 operates to adjust the time difference between the output clock (i.e., the FB clock 14) and the input Ref clock 12 until they are aligned. The phase detector 18 generates the shift left and shift right signals depending on the detected phase difference or timing difference between the Ref clock 12 and the PB clock 14.

FIG. 2 illustrates exemplary timing relationships among various clock signals operated on by the phase detector 18 in the DLL 10 in FIG. 1. The Ref clock 12 and the FB clock 14 are input to the phase detector 18, which generates the shift left on shift right signals depending on whether the rising edge of the Ref clock 12 appears before or after the rising edge of the FB clock 14, in practice, the DLL 10 is considered "locked" (i.e., the Ref clock 12 and the PB clock 14 are "synchronized") when the rising edges of the Ref clock 12 and the PB clock 14 are substantially aligned. As shown in part (a) in FIG. 2, when the Ref clock 12 is "leading" or "faster" than the PB clock 14 (i.e., when the rising edge of the Ref clock 12 appears before the rising edge of the PB clock 14) by the time amount equal to "$t_{PE}$", the PD 18 may generate a shift right (SR) indication to instruct the delay line 16 to right shift the Ref clock 12 by "$t_{PE}$" to achieve the lock condition. Similarly, as shown in part (b) in FIG. 2, when the Ref clock 12 is "slower" than or "lagging" the FB clock 14 (i.e., when the rising edge of the Ref clock 12 appears after the rising edge of the FB clock 14) by the time amount "$t_{PE}$", the PD 18 may generate a shift left (SL) signal to instruct the delay line 16 to left shift the Ref clock 12 by "$t_{PE}$" to establish the lock. The parameter $t_{PE}$ ($t_{PE}$ 0) may indicate a small phase error between the PB clock 14 and the Ref clock 12, especially when the PB clock 14 is almost in phase with the Ref clock 12. As discussed below with reference to FIG. 3, in such a situation, the DLL 10 may lock to the either end of the delay line 16.

FIG. 3 depicts delay line lock point locations for the clock signals in FIG. 2 using a traditional DLL locking mechanism (e.g., the DLL 10 in FIG. 1). In conventional DLL locking mechanisms, when the feedback signal (the FB clock 14) is almost in phase with the reference signal (the Ref clock 12), as illustrated in parts (a) and (b) in FIG. 2, the DLL may lock to either end of the delay line 16. FIG. 3 symbolically designates the right end of the delay line 16 as its initial signal entry point 31. In case (b) in FIG. 2, upon entry into the delay line 16 at the initial entry point 31, the Ref clock may be shifted left to establish the lock point 33 that represents a delay of "$t_{PE}$" from the initial entry point 31. Thus, the lock point 33 remains close to the right end of the delay line 16. On the other end, for case (a) in FIG. 2, because the initial entry Point 31 is fixed at the right end of the delay line 16, the Ref clock 12 may not be further shifted right by "$t_{PE}$", but, instead, may have to be shifted left by an amount of delay equal to "$t_{CK} - t_{PE}$" so as to establish the lock point 32 close to the other (left) end of the delay line 16. The clock period of the Ref clock 12 (or the Ref* 30) is designated as "$t_{CK}$" As is observed with reference to the traditional look point establishment mechanism illustrated in FIG. 3, there may not be enough room for additional tuning or locking range after the initial lock is established or a longer lock time may be required because of the locking performed towards either end of the delay line 16, instead of towards the center of the delay line. For example, in case of the lock point (b) in FIG. 3, an additional spare delay 34 may be required as part of the delay line 16 for better tuning range (e.g., to accommodate voltage, temperature and frequency fluctuations) after the initial lock 33. The spare delay 34 may increase circuit power consumption and may represent additional hardware. On the other hand, in case of the lock point (a) in FIG. 3, a force-shift-left logic may be required to left shift the Ref clock 12 front the initial entry point 31. Also, in case of lock point (a) longer lock time (from "$t_{PE}$" to "$t_{CK}$" $t_{PE}$") and, hence, longer delay line 16 may be required.

Therefore, it is desirable to lock a digital synchronous circuit (e.g., a DLL) at the center of or close to the center of the delay line to reduce initial lock time and provide extra tuning range in the event of voltage, temperature and frequency changes after the initial lock is established, but without increasing the size or changing the configuration of the delay line or without requiring a spare delay. When the synchronous circuit is tuned at the center or close to the center of its delay line, more room is available to accommodate voltage, temperature and frequency fluctuations that may affect the initially-established lock.

SUMMARY

The present disclosure contemplates a method of operating a synchronous circuit. The method comprises obtaining a reference clock and an inverted reference clock for the synchronous circuit; using a delay line as part of the synchronous circuit to generate a feedback clock; and selectively using one of the reference clock and the inverted reference clock as an input to the delay line based on a relationship among the phases of the reference clock, the inverted reference clock, and the feedback clock.

In one embodiment, the method of operating a synchronous circuit comprises obtaining a reference clock and an inverted reference clock for the synchronous circuit; using a delay line as part of the synchronous circuit to generate a feedback clock; obtaining a delayed feedback clock from the feedback clock; and selectively using one of the reference clock and the inverted reference clock as an input to the delay line based on a relationship among the phases of the reference clock, the inverted reference clock, the feedback clock and the delayed feedback clock.

In another embodiment, the present disclosure contemplates a method of operating a synchronous circuit, where the method comprises obtaining a reference clock and an inverted reference clock for the synchronous circuit; using a delay line as part of the synchronous circuit to generate a feedback clock; obtaining a delayed feedback clock from the feedback clock; and selectively using one of the reference clock and the inverted reference clock as an input to the delay line based on individual sampling of the reference clock and the inverted reference clock with each of the feedback clock and the delayed feedback clock.

In yet another embodiment, the present disclosure contemplates a method of operating a synchronous circuit, where the method comprises obtaining a reference clock and an inverted reference clock for the synchronous circuit; using a delay line as part of the synchronous circuit to generate a feedback clock; obtaining a delayed feedback clock from the feedback clock; and selectively using one of the reference clock and the inverted reference clock as an input to the delay line based on a relationship among the phases of the reference clock, the inverted reference clock, and one of the feedback clock and the delayed feedback clock.

In a further embodiment, the present disclosure contemplates a synchronous circuit comprising a delay line to receive an input clock and to generate a feedback clock therefrom, wherein the delay line is configured to provide a predetermined delay to the input clock to generate the feedback clock therefrom; and a decoder circuit coupled to the delay line and configured to receive the feedback clock as a first input and to generate a delayed feedback clock therefrom, wherein the decoder circuit is further configured to receive a reference clock as a second input and an inverted reference clock as a third input, wherein the decoder circuit is configured to determine a relationship among the phases of the reference clock, the inverted reference clock, and at least one of the feedback clock and the delayed feedback clock, and to selectively supply one of the reference clock and the inverted reference clock as the input clock to the delay line based on determination of the phase relationship.

In a still further embodiment, the present disclosure contemplates a memory device including a synchronous circuit (e.g., a delay locked loop) constructed according to the teachings of the present disclosure. In an alternative embodiment, the present disclosure contemplates a system that comprises a processor, a bus, and a memory device coupled to the processor via the bus and including the synchronous circuit.

The system and method of the present disclosure establish the lock point of a digital synchronous circuit (e.g., a DLL) at the center of or close to the center of its delay line to provide for extra tuning range in the event of voltage, temperature and frequency changes after the initial lock is established, The selective use of the opposite phase of the reference clock (i.e., (he inverted version of the reference clock) for the input of the delay line allows for addition or removal of half cycle of delay to centralize the final lock point of the delay line, The switching between the reference clock and the inverted reference clock results in centralization of the lock point for most cases as well as improvement in the tuning range and the time to establish the initial lock, without requiring an additional delay line or without increasing the size or changing the configuration of the existing delay line.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state memories or memory-based systems. It is noted at the outset that the terms "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

Figure 1:
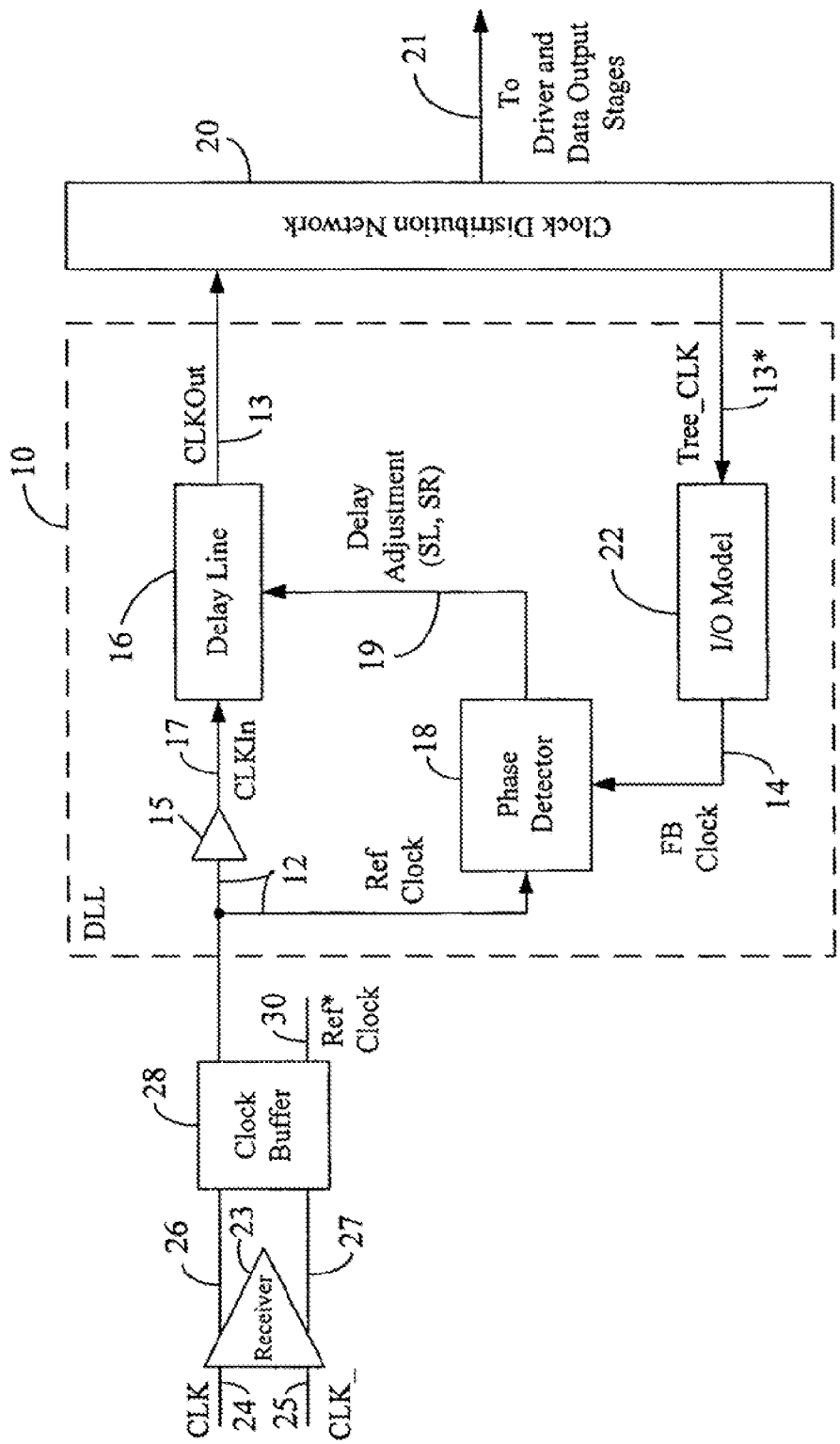
FIG. 1 depicts a simplified block diagram of a prior art delay-locked tool) (DLL) that can be internal to an SDRAM.
Figure 4:
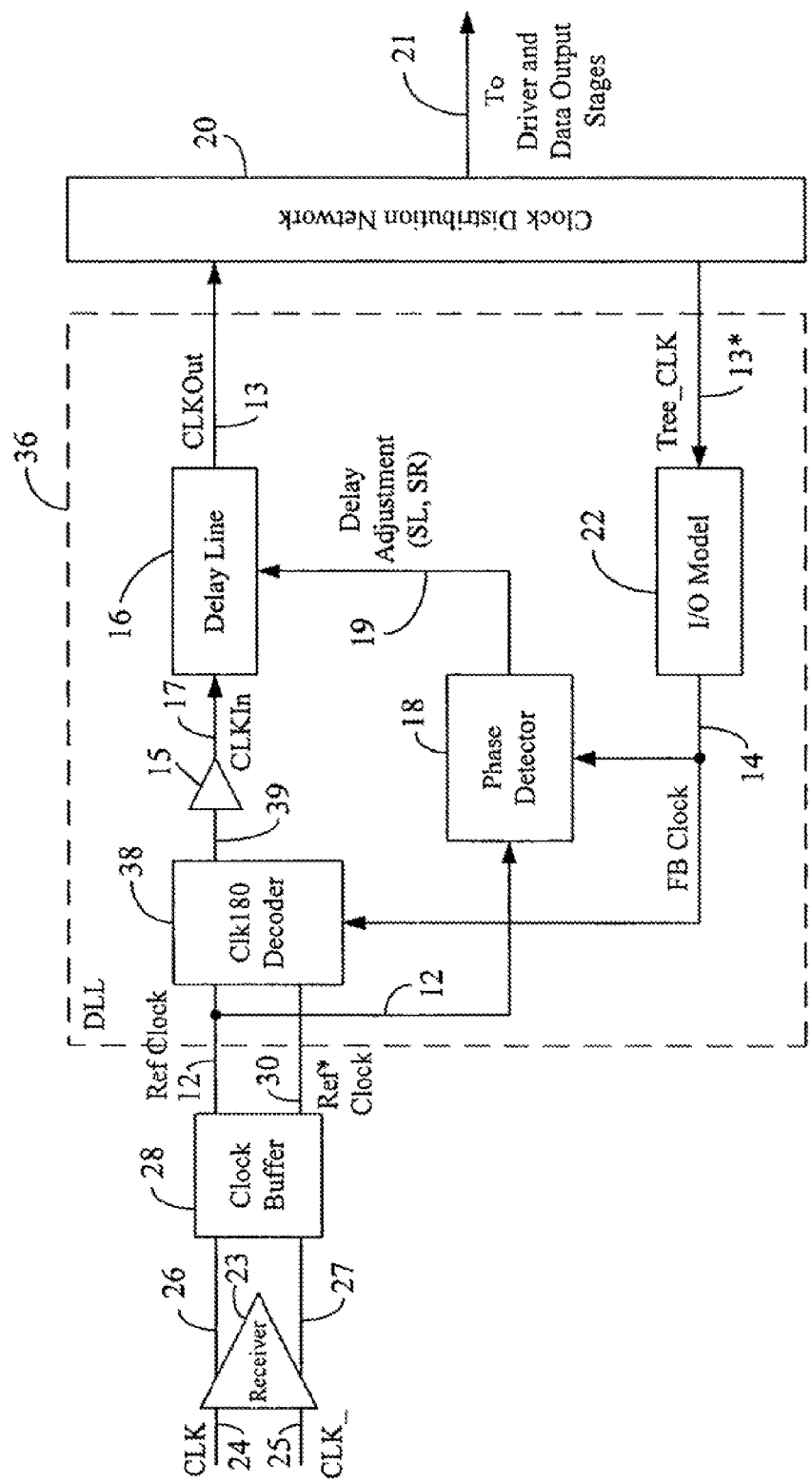
FIG. 4 is a simplified block diagram of a delay-locked loop (DLL according to one embodiment of the present disclosure.
Figure 13:
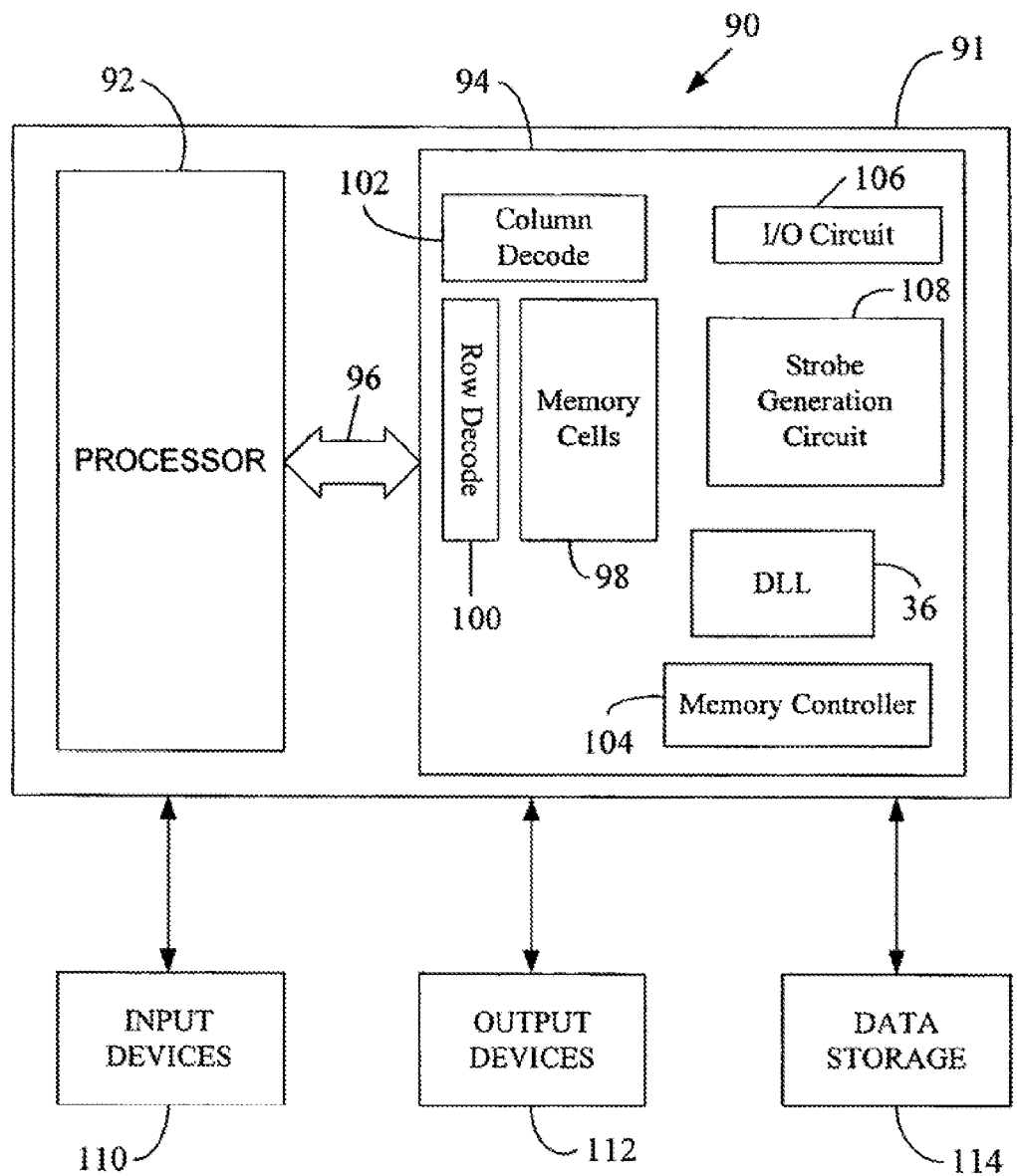
FIG. 13 is a block diagram depicting a system in which a synchronous circuit (e.g., the DLL in FIG. 4) constructed according to the teachings of the present disclosure may be used.

FIG. 4 is a simplified block diagram of a delay-locked loop (DLL) 36 according to one embodiment of the present disclosure. As noted before, the DLL 30 is one type of synchronous circuit that can be internal to any integrated circuit including, for example, an SDRAM memory unit (as shown, for example, in FIG. 13). It is pointed out that throughout the discussion herein the same reference numerals are used to designate identical circuit elements or signal waveforms, and/or to also facilitate ease of discussion. A comparison of the DLL in FIG. 1 and the DLL 36 in FIG. 4 shows that the DLL 36 additionally includes a Clk 180 decoder 38 (interchangeably referred to herein as the "clock decoder" or the "decoder" 180). However, the overall function of the DLL 36 is identical to that of the DLL 10, which is to synchronize the external clock 12 with the internal clock 14.

Figure 11:
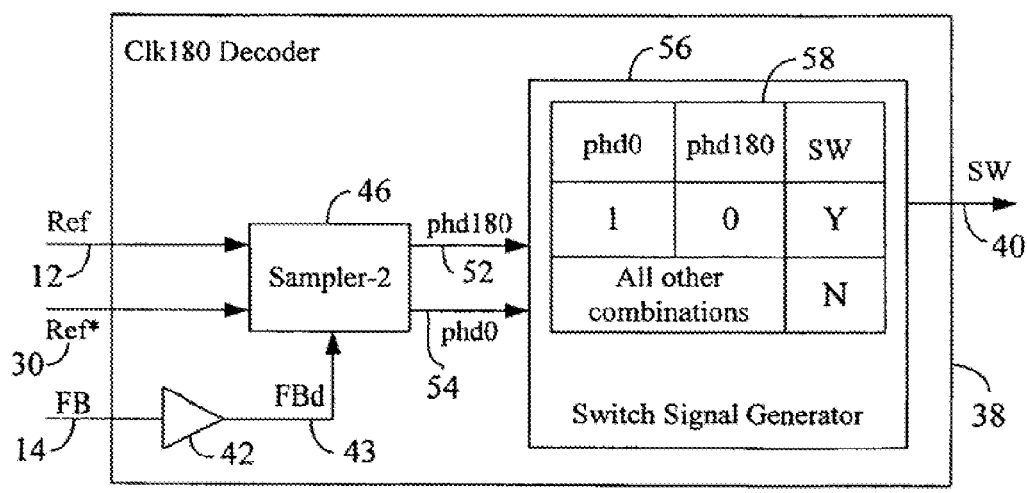
FIG. 11 depicts another embodiment of the clock decoder shown in FIG. 8.
Figure 12:
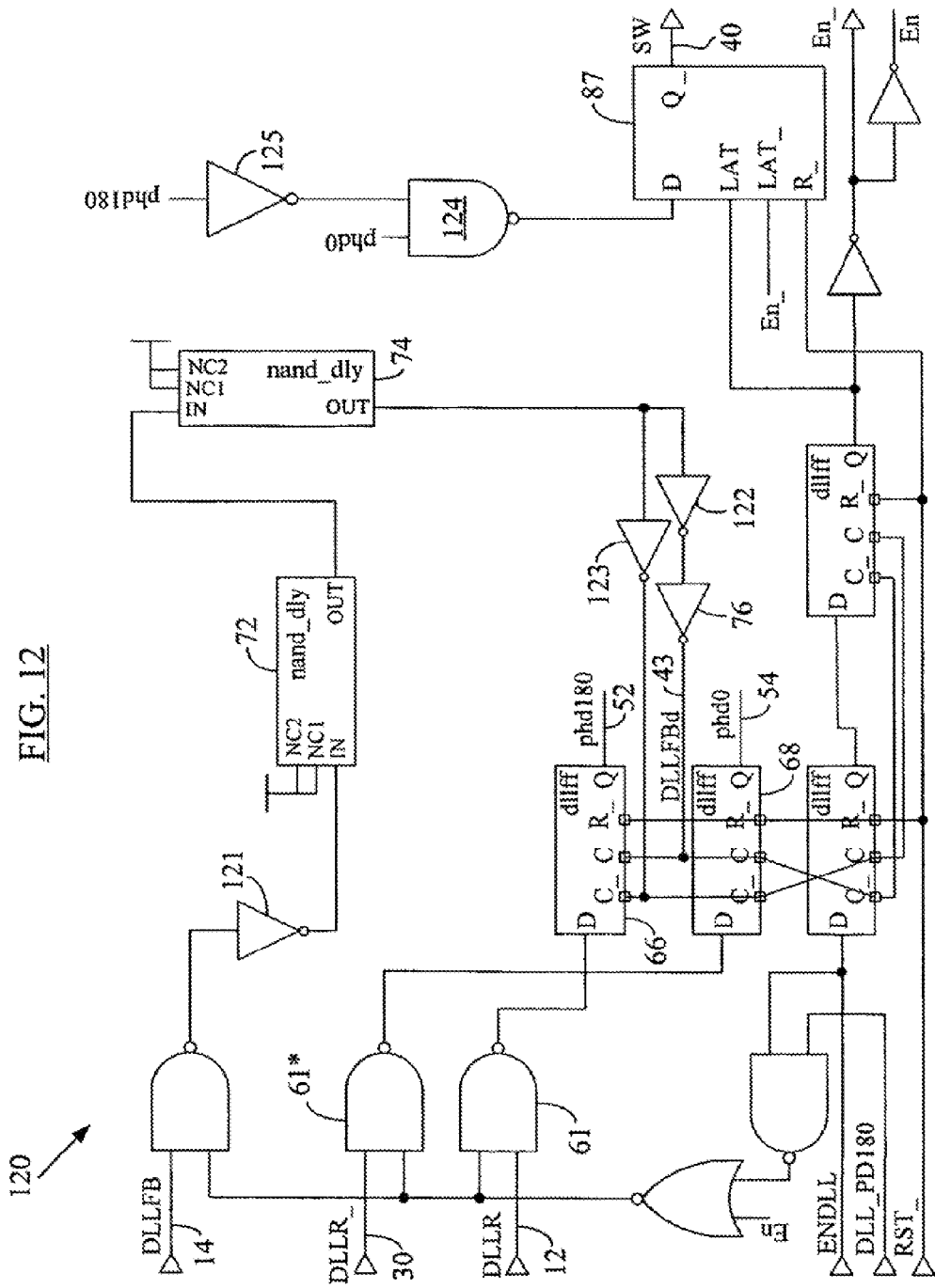
FIG. 12, which is substantially similar to FIG. 9, shows an exemplary circuit layout implementing various circuit blocks of the clock decoder depleted in FIG. 11.

As shown in FIG. 4, the decoder 38 receives not only the reference clock 12, but also the inverted reference clock 30 as inputs. Thus, even though the DLL 36 is a single delay line DLL, both the reference clocks 12, 30 are input to the DLL 36, instead of just one Ref clock 12 in the DLL 10 in FIG. 1. The decoder 38 also receives the FB clock 14 as an additional input. The clock decoder 38 determines which one of the reference clocks—Ref clock 12 or the Ref* clock 30—should be input to the delay line 16 as the CLKIn signal 17. This determination is made, as explained later in more detail, based on the phase relationship among the clocks—Ref 12, Ref* 30, and FB 14. In the decoder 38 in FIG. 4, a delayed version of the FB clock (e.g., the FBd clock 43 in FIG. 8) may also be used to determine the phase relationship as discussed later with reference to FIGS. 8 and 11. When a certain predetermined phase relationship exists among these four clocks, the decoder 38 supplies the Ref* clock 30 to the delay line 16 instead of the Ref clock 12. It is noted here that the decoding (or clock selection) operation by the decoder 38 is performed prior to any phase comparison by the phase detector 18 and also prior to commencement of any delay adjustment in the delay line 16.

Figure 2:
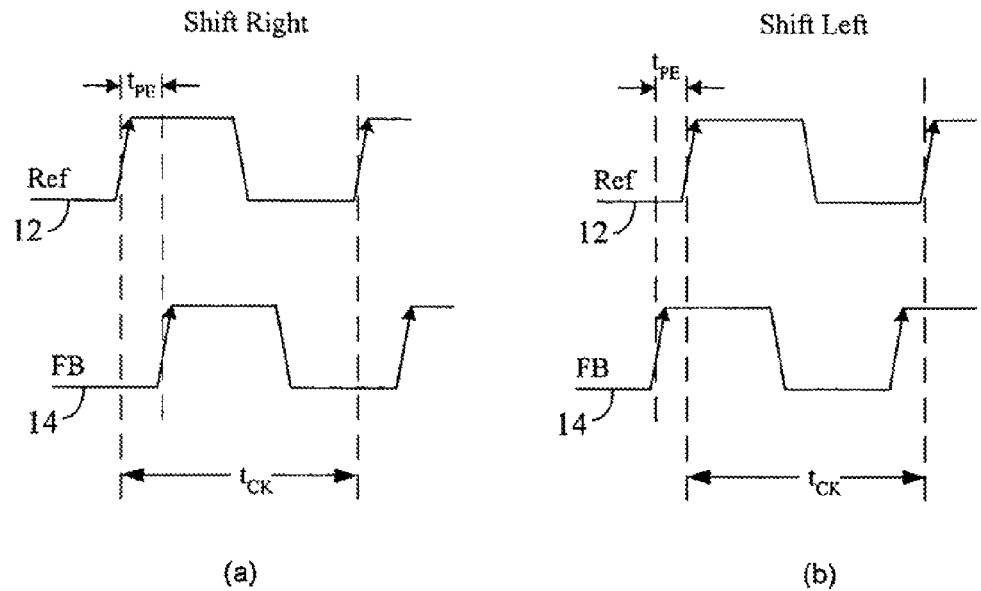
FIG. 2 illustrates exemplary timing relationships among various clock signals operated on by the phase detector in the DLL in FIG. 1.

As discussed in more detail later with reference to, for example, FIGS. 5-6, the decoder's 38 selection of Ref* 30 instead of Ref 12 to be input to the delay line 16, results in centralization of lock points, especially in situations when the FB clock 14 is almost in phase with the Ref clock 12 (e.g., the timing diagrams (a) and (b) in FIG. 2). Thus, the DLL 36 according to the present disclosure selectively feeds either the Ref clock 12 or the Ref* clock 30 as the clock input (CLKIn 17) to the delay line 16 based on the logic value of a switching signal (SW) 40 (discussed later with reference to FIGS. 8-9 and 11-12). The delay line 16 then applies the requisite delay (per signals received from the PD 18) to its input clock CLKIn signal 17, which may be the Ref clock 12 or the Ref* clock 30 depending on the activation of the SW signal 40. As discussed below, the selective use of the opposite phase of the Ref clock 12—i.e., the Ref* clock 30—for the input (the CLKIn signal 17) to the delay line 16 allows for addition or removal of half cycle of delay to centralize the final lock point of the delay line 16. It is noted that the delay line 16 may be a symmetrical delay line, i.e., a delay line that has the same delay whether a high-to-low or a low-to-high logic signal is propagating along the line.

Figure 3:
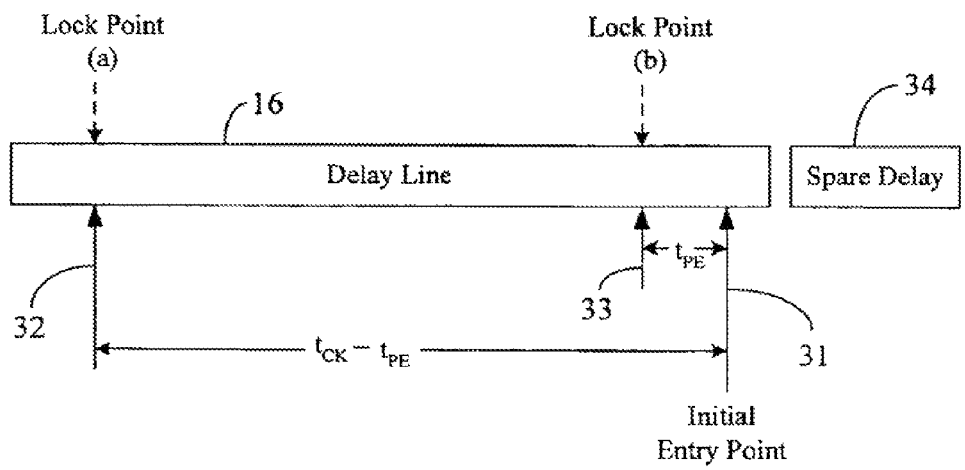
FIG. 3 depicts delay line lock point locations for the clock signals in FIG. 2 using a traditional DLL locking mechanism.
Figure 5:
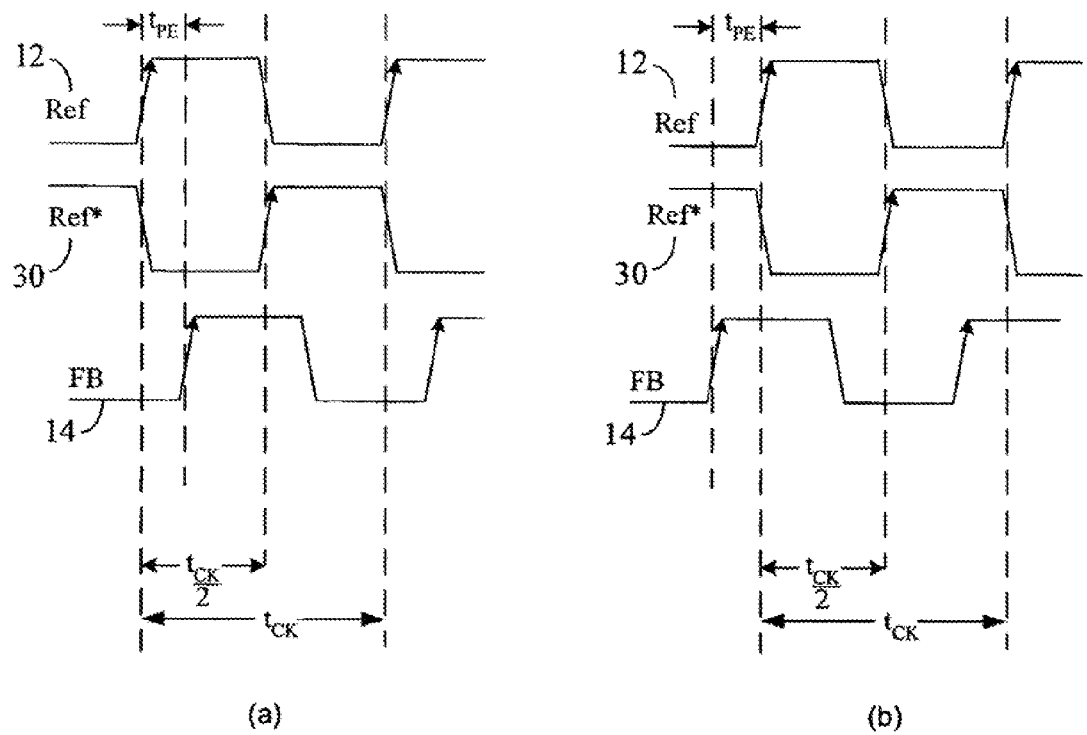
FIG. 5 illustrates an exemplary timing relationship among different clock signals operated on by the clock decoder circuit in the DLL in FIG. 4.

FIG. 5 illustrates exemplary timing relationship among different clock signals operated on by the clock decoder circuit 38 in the DLL 30 in FIG. 4. The Ref clock 12 is shown along with its inverted version Ref* 30. The timing relationships in parts (a) and (b) are identical to the corresponding timing relationships in parts (a) and (b) in FIG. 2, except for the presence of the Ref* clock 30 in FIG. 5. Thus, the timing diagrams in FIG. 5 also illustrate the situation when the feedback signal 14 is almost in phase with the reference signal 12. The minor phase differential (or phase error) is indicated by the time parameter "$t_{PE}$". As discussed earlier with reference to FIG. 3, when the signals (except for the Ref* clock 30) in parts (a) and (b) in FIG. 5 are present in the circuit configuration of FIG. 1, the required delay (shift left) to establish the lock (i.e., aligning the rising edge of Ref 12 with the rising edge of FB 14) is "$t_{CK}-t_{PE}$" and "$t_{PE}$" respectively. However, when Ref* 30 is used (based on the logic level of the SW signal 40 as discussed later with reference to FIGS. 8 and 11) instead of Ref 12 as an input CLKIn 17 to the delay line 16 according to the teachings of the present disclosure, the required delay (shift left) to establish the lock may be reduced from "$t_{CK}-t_{PE}$ to $$\frac{t_{CK}}{2} - t''_{PE}$$

in case (a) in FIG. 5. In case of waveforms in part (b) in FIG. 5, however, the delay (shift left) is increased from "$t_{PE}$" to $$\frac{t_{CK}}{2} + t_{PE}$$

when Ref* 30 is used as the CLKIn signal 17. As the delay line 16 may be configured to always shift left initially, when Ref* 30 is used as the CLKIn signal 17, the lock point locations for the waveforms in parts (a) and (b) in FIG. 5 move towards the center of the delay line 16 as discussed with reference to FIG. 6.

Figure 6:
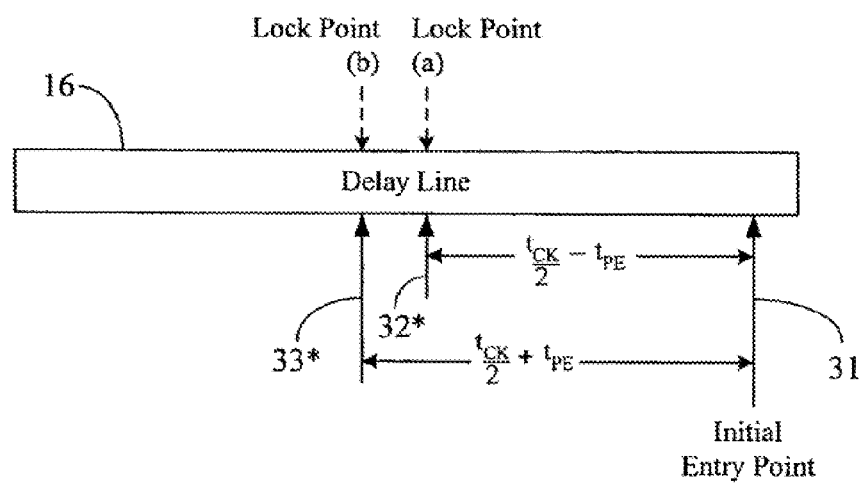
FIG. 6 shows delay line lock point locations for the clock signals in FIG. 5 using the DLL locking mechanism of FIG. 4.

FIG. 6 shows delay line lock point locations for the clock signals in FIG. 5 using the DLL locking mechanism of FIG. 4. As can be seen front FIGS. 5 and 6, the lock points 32* and 33* for the clocks in parts (a) and (b) In FIG. 5, respectively, are moved substantially to the center of the delay line 16 when Ref* 30 is used as the clock input CLKIn 17 to the delay line 16. Furthermore, because of the centralization of the lock points, the spare delay 34 (FIG. 3) may be removed, thereby reducing the intrinsic delay and power consumption in the delay line 16.

Figure 7:
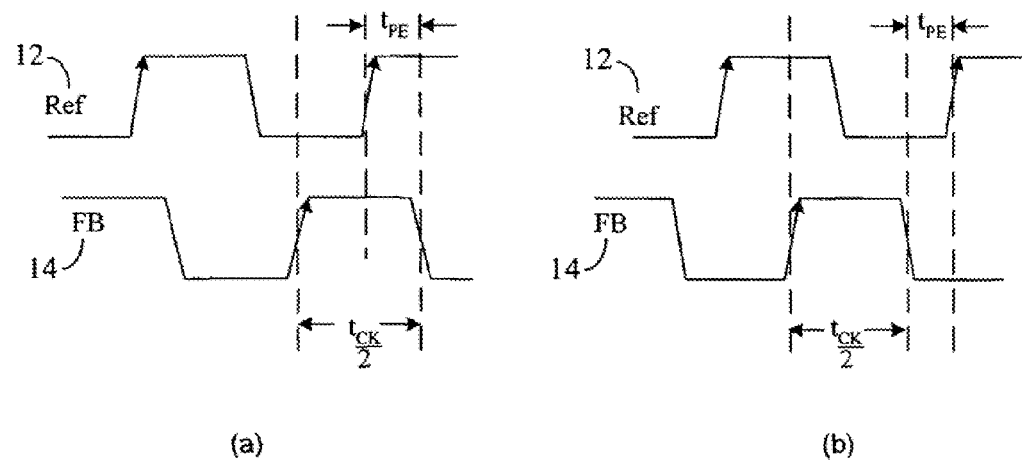
FIG. 7 illustrates exemplary timing relationship among different clock signals operated on by the phase detector in the DLL in FIG. 4 when the inverted reference clock is input to the delay line by the clock decoder in the DLL.

FIG. 7 illustrates exemplary timing relationship among different clock signals operated on by the phase detector 18 in the DLL 36 in FIG. 4 when the inverted reference clock (Ref* 30) is input to the delay line 16 by the clock decoder 38 in the DLL 36. It is observed that the Ref* clock 30 is not input to the PD 18. Instead, only the Ref clock 12 is input to the PD 18 as is the ease in the conventional DLL 10. Initially, the Ref clock 12 is input to the delay line 16 as is done in conventional DLL circuits (e.g., the DLL 10 in FIG. 1). Thereafter, the decoder 38 may "observe" the timing relationship between the Ref clock and the FB clock 14, and may determine to input the Ref* clock 30 to the delay line 16 instead of Ref 12 when a predetermined phase relationship (e.g., the waveforms shown in FIG. 5) exists among Ref 12, Ref* 30, and FB 14 as discussed later with reference to FIGS. 8 and 11. When the decoder 38 determines to input Ref* 30 to the delay line 16, the waveforms obtained for the FB clock 14 (which is also input to the PD 18) would be half clock cycle (0.5 $t_{CK}$) delayed versions of those waveforms shown in parts (a) and (b) in FIG. 5 as can be observed from a comparison of respective waveforms in FIGS. 5 and 7. As can be seen from the exemplary timing diagrams in parts (a) and (b) in FIG. 7, the delay adjustment determined by the PD 18 using the Ref clock 12 and the FB clock 14 (generated from the Ref* clock 30 being input to the delay line 16) is identical to the values given in FIG. 6 for the respective tinting waveforms in parts (a) and (b) in FIG. 5. Therefore, even though the reference clocks that are input to the delay line 16 (the Ref* clock 30) and the PD 18 (the Ref clock 12) are different, the computation of delay values remains unaffected.

Figure 8:
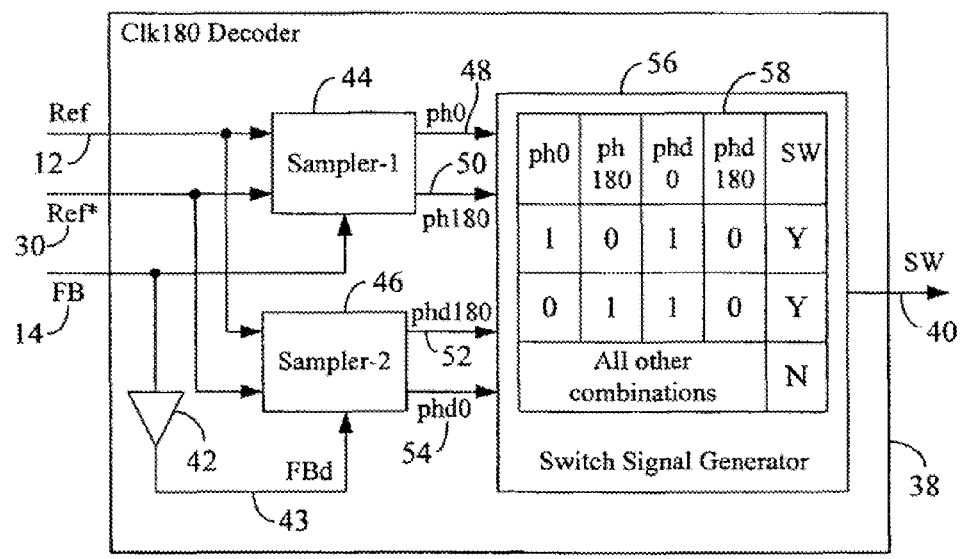
FIG. 8 depicts an exemplary block diagram showing relevant circuit details according to one embodiment of the present disclosure for the clock decoder in FIG. 4.

FIG. 8 depicts an exemplary block diagram showing relevant circuit details according to one embodiment of the present disclosure for the clock decoder 38 in FIG. 4. It is noted here that only those circuit details or circuit elements relevant to the present discussion are shown in FIG. 8. It is understood, however, that the clock decoder 38 in FIG. 8 may include additional circuit elements to make it a fully operational entity as part of, for example, the DLL 36. In the embodiment shown in FIG. 8, the clock decoder 38 receives Ref 12, Ref* 30, and FB 14 as inputs. The delayed feedback clock FBd 43 is generated by inserting a predetermined time delay "$t_D$" into the FB clock 14 using a delay element 42. The delay "$t_D$" is internal to the clock decoder 38 and does not affect the delay determinations by the PD 18. The amount of delay "$t_D$" may determine the location of the lock points and may provide a margin to adjust the locations of the lock points (e.g., closer to right end, or left end, or exact center, etc.) in the delay line 16. It may be desirable to "guard band" $t_D$, to leave the lock point away from the initial entry point. However, as the location of the eventual lock point may not be known beforehand, the predetermined delay "$t_D$" between FB 14 and FBd 43 may be determined based on how far away the lock point can be moved from the initial entry point, the frequency of the feedback clock 14, and whether the tuning range of the DLL, 36 after establishing the initial lock between the reference clock 12 and the feedback clock 14 is enough to accommodate expected PVT (process or frequency, voltage, temperature) variations during run time, For example, in the timing diagram illustrated in FIG. 10, the value of "$t_D$" is in the range between $t_{PE}$, and "$0.5t_{CK}$" so as to maintain the selection of the Ref* clock 30 as the CLKIn signal 17. If the value of "$t_D$" does not fall in this range, then, in the embodiment of FIGS. 10-11, for example, (the decoder 38 may not select Ref* clock 30 as the CLKIn signal 17 because the switch signal (SW) 40 in FIG. 11 may not be "ON" or "active" in that situation as discussed later below. The delay element 42 may be implemented in a number of ways known in the art including, for example, using AND gates, crossed inverters, an all NAND-based delay element, or a combination of various gate elements (as discussed with reference to FIGS. 9 and 12), etc.

Figure 9:
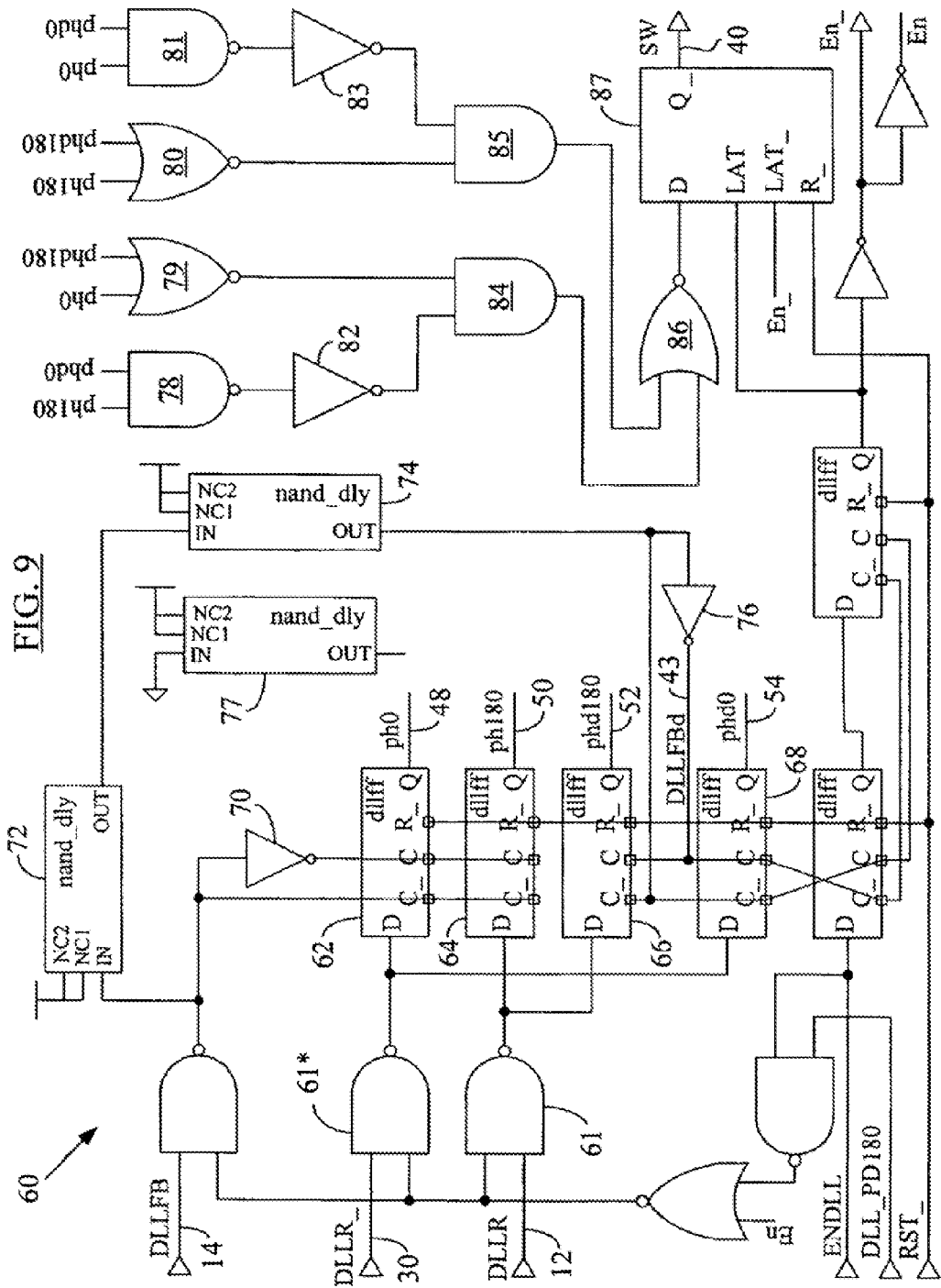
FIG. 9 shows an exemplary circuit layout implementing various circuit blocks of the clock decoder depicted in FIG. 8.
Figure 10:
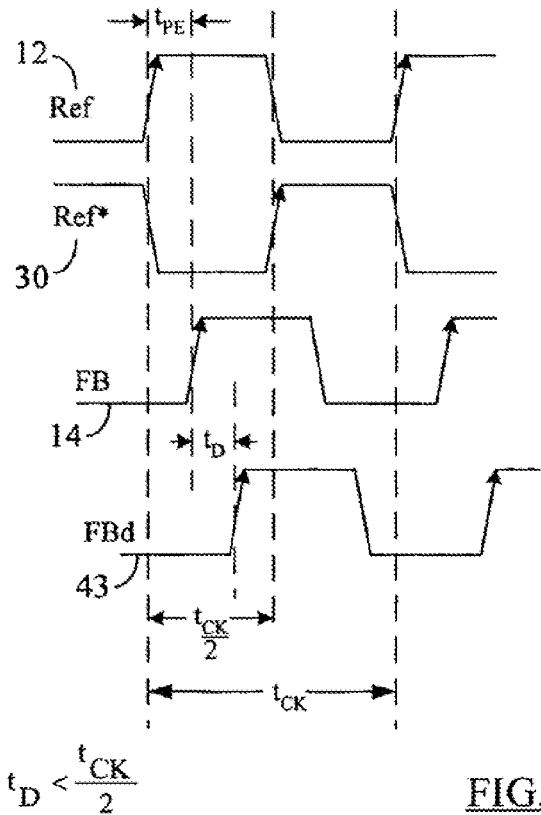
FIG. 10 illustrates a clock timing relationship that is substantially similar to the timing relationship depicted in part (a) in FIG. 5, except that an additional clock signal—the delayed version of the feedback clock—is also shown.

As shown in FIG. 8, the Ref clock 12 and the Ref* clock are sampled by the FB clock 14 using a sampler circuit 44 (sampler-1) to determine the phase relationship between Ref 12, Ref* 30, and FB 14. On the other hand, sampler-2 (46) uses the FBd clock 43 to sample the Ref clock 12 and the Ref* clock 30. The sampler circuits 44, 46 may be D-type flip-flops clocked by respective sampling signals FB 14 or FBd 43 whose rising edges sample the reference clocks Ref 12 and Ref* 30. FIG. 9 shows an exemplary circuit layout 60 implementing various circuit blocks of the clock decoder 38 depicted in FIG. 8. As can be seen from FIG. 9, sampler-1 (44) may include the D-type flip-flops 62 and that receive inverted versions (because of the presence of NAND gates 61 and 61*) of the input clocks Ref* 30 (designated as signal DLLR in FIG. 9) and Ref 12 (designated as signal DLLFB in FIG. 9) respectively. each input clock (Ref or Ref*) It is individually sampled by the FB clock 14 (designated as DLLFB signal in FIG. 9) when the DLLFB signal and its inverted version (generated by the inverter 70 in FIG. 9) are applied as clock inputs to flip-flops 62, 64. Similarly, sampler-2 (46) may include the D-type flip-flops 66 and 68 that also receive the inverted versions of the input clocks Ref 12 (designated as signal DLLR in FIG. 9) and Ref* 30 (designated as signal DLLR_ in FIG. 9) respectively. Each input clock (Ref or Ref*) is individually sampled by the FBd clock 43 (designated as DLLFBd signal in FIG. 9) when the DLLFB signal and its inverted version (available at the output of the NAND delay element 74 in FIG. 9) are applied as clock inputs to flip-flops 66, 68. It is seen from FIG. 9 that the delay element 42 is implemented through a combination of two NAND delays 72, 74 and an inverter 76. The output of the inverter 76 is the FEd clock 43 in FIG. 8, whereas the output of the NAND) delay 74 is the inverted version of FBd to be supplied as a clock input to the D-type flip-flops 66,68 as noted before. The duration of the delay ("$t_D$") between FB 14 and FBd 43 clocks may be adjusted by adding another NAND delay or removing one or more of the NAND delays 72, 74 (and appropriately modifying the circuit connections) into (the DLLFB signal in FIG. 9 (i.e., the FB clock 14 in FIG. 8) when needed.

Referring back to FIG. 8, each of the clocks Ref 12 and Ref* 30 is individually sampled with one of the clocks FB 14 and FBd 43 to determine whether a specific phase relationship (e.g., the phase relationships depicted in the timing waveforms in FIG. 5) exists among the clocks Ref 12, Ref* 30, and FB 14. The FBd clock 43 assists in determining the specific phase relationship (discussed later). Each sampler 44, 46 outputs two phase relationship signals—sampler-1 (44) outputting the signals ph0 (48) and ph180 (50), whereas sampler-2 (46) outputting the signals phd0 (54) and phd180 (52). The ph0 signal 48 is generated (i.e., goes "high" or logic "1") when the sampled value of the reference clock 12 at the time of sampling by the (rising edge of) feedback clock 14 is "high" or logic "1." On the other hand, the ph180 signal 50 becomes "high" or logic "1" when the sampled value of the inverted reference clock 30 at the time of sampling by the (rising edge of) feedback clock 14 is "high" or logic "1."

Similarly, the phd0 signal 52 is "high" or in logic "1" state when the sampled value of the reference clock 12 at the time of sampling by the (rising edge of) delayed feedback clock 43 is "high" or logic "1", and the phd180 signal becomes "high" or logic "1" when the sampled value of the inverted reference clock 30 at the time of sampling by the (rising edge of) the delayed feedback clock 43 is "high" or logic "1." An exemplary generation of these phase relationship signals ph0, ph180, phd0 and phd180 is illustrated in the circuit layout in FIG. 9. In FIG. 9, because the clocks get inverted by the NAND gates 61 and 61*, the pho 48 and phdo 54 signals are generated using the Ref* clock (the DLLR_ input 30), whereas the phd180 50 and phd180 52 signals are generated using the Ref clock (the DLLR signal 12) to obtain the sampling described hereinbefore. It is observed here that the use of FB 14 and FB 43 to sample values of Ref 12 and Ref* 30 In samplers 4, 46 results in a determination of phase relationships among Ref, Ref*, fB, and FBd: (1) Signals ph0 and ph180 reflect the phase relationship among Ref 12, Ref* 30, and FB 14, and (2) signals phd0 and phd 180 reflect the phase relationship among Ref 12, Ref* 30, and FBd 43.

As shown hi FIG. 8, the outputs pho, ph 180, phdo, and phd 180 from the samplers 44,46 are fed as inputs to a switch signal generator 56, which operates on these inputs according to a predetermined truth table 58 to generate the switching signal SW 40 as its output. In the embodiment of FIG. 9, the switch signal generator 56 is shown implemented using the logic elements 78-87. From the truth table 58, it is seen that the switching signal 40 is generated or becomes "active" (i.e., logic "high" or "1") under two sets of values (logic 1's or 0's) for the outputs of the samplers 44, 46: (1) When ph0=1, ph 180=0, phd0=1, phd180=0; and (2) when ph0=0, ph180=1, phd0=1, and phd 180=0, These two sets of values may represent whether the PB clock 14 leads or lags the Ref clock 12 by the small phase error "$t_{PE}$," These two sets of values may, for example, correspond to the timing relationships in Parts (a) and (b), respectively, in FIG. 5 (when appropriate value for "$t_D$" is set for the generation of the delayed feedback clock 43). In all other combinations of the sampler outputs, the SW signal 40 remains inactive or "low" or logic "0." Thus, the switching signal 40 becomes active only when a specific phase relationship exists among the clocks Ref, Ref*, FB, and FBd, as reflected in the values (given by the truth table 58) of the output signals ph0, ph180, phd0, and phd180. That specific phase relationship (indicated by the values in the truth table 58) represents a need to centralize the lack point of the delay line 16 so as to avoid the extreme locking situations discussed hereinbefore with reference to FIG. 3. In all other phase relationships among various input and output clocks, the SW signal 40 is inactive (or "low" or logic "0"), indicating lack of a need to change the input clock phase to centralize the lock point. As noted before, when the SW signal 40 is "ON" or active (logic "1"), the Ref* clock 30 is input into the delay line 16, instead of the Ref clock 12. On the other hand, when the SW signal 40 is "OFF" or inactive (logic "0"), the Ref clock 12 is input into the delay line 16. The switching between the Ref clock 12 and the Ref* clock 30 as the CLKIn input 17 into the delay line 16 allows the DLL 30 to obtain locks that are positioned substantially close to the center of the delay line 16 regardless of whether the FB clock 14 is leading or lagging the input reference clock 12.

The invention claimed is:

1. A decoder, comprising:
   an output; and
   first and second inputs, said first input configured to receive a reference clock signal and said second input configured to receive an inverted reference clock signal, said decoder being configured to supply either said reference clock signal or said inverted reference clock signal to a delay element connected to said output of said decoder based on a phase relationship among said reference clock signal, said inverted reference clock signal, and a feedback clock.

2. The decoder of claim 1 additionally comprising a sampler connected to said first input and a switch signal generator connected to said sampler and to said output.

3. The decoder of claim 2 wherein said sampler is configured to receive said reference clock signal and said inverted reference clock signal as inputs, said sampler further configured to be responsive to said feedback clock.

4. The decoder of claim 2 wherein said sampler is configured to be responsive to a delayed version of said feedback clock.

5. The decoder of claim 1 further comprising a plurality of samplers connected to said first and second inputs and a switch signal generator responsive to said plurality of samplers.

6. The decoder of claim 5 wherein said plurality of samplers is configured to receive said reference clock signal and said inverted reference clock signal as inputs.

7. The decoder of claim 6 wherein said plurality of samplers is responsive to said feedback clock and a delayed version of said feedback clock.

8. The decoder of claim 1 further comprising a first sampler connected to said first input and a second sampler connected to said second input, said first sampler configured to receive said reference clock signal and said second sampler configured to receive said inverted reference clock signal as inputs, said decoder further comprising a switch signal generator responsive to said first and second samplers for producing a switching signal.

9. The decoder of claim 8 wherein said first sampler is responsive to said feedback clock and said second sampler is responsive to a delayed version of said feedback clock.

10. A delay locked loop, comprising:
a forward delay line;
a feedback loop responsive to said forward delay line for producing a feedback clock;
a decoder for receiving a reference clock signal, an inverted reference clock signal, and said feedback clock, said decoder outputting either said reference clock signal or said inverted reference clock signal to said forward delay line based on a phase relationship between said reference clock signal, said inverted reference clock signal, and said feedback loop signal; and
a phase detector configured for controlling said forward delay line based on a comparison of the phase relationship between said reference clock signal and said feedback clock.

11. The delay locked loop of claim 10 wherein said decoder additionally comprises a sampler configured to receive said reference clock signal and said inverted reference clock signal as inputs, said sampler further configured to be responsive to said feedback clock, said decoder additionally comprising a switch signal generator responsive to said sampler to output either said reference clock signal or said inverted reference clock signal.

12. The delay locked loop of claim 10 wherein said decoder additionally comprises a first sampler configured to receive said reference clock signal, a second sampler configured to receive said inverted reference clock signal, said first sampler further configured to be responsive to said feedback clock and said second sampler configured to be responsive to a delayed feedback clock, said decoder further comprising a switch signal generator responsive to said first and said second samplers to enable said decoder to output either said reference clock signal or said inverted reference clock signal.

13. A method of operating a synchronous circuit, comprising:
obtaining a reference clock and an inverted reference clock for said synchronous circuit;
using a delay line as part of said synchronous circuit to generate a feedback clock;
obtaining a delayed feedback clock from said feedback clock; and
selectively using one of said reference clock and said inverted reference clock as an input to said delay line utilizing a decoder positioned prior to said delay line, said selection based on a relationship among the phases of said feedback clock, said delayed feedback clock, samples of said reference clock, and samples of said inverted reference clock.

* * * * *